US008212802B2

(12) United States Patent
Jeon (10) Patent No.: US 8,212,802 B2
(45) Date of Patent: Jul. 3, 2012

(54) DRIVING APPARATUS OF DISPLAY DEVICE AND DISPLAY DEVICE INCLUDING THE SAME

(75) Inventor: Sang-Jin Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 914 days.

(21) Appl. No.: 11/929,325

(22) Filed: Oct. 30, 2007

(65) Prior Publication Data

US 2008/0191980 A1 Aug. 14, 2008

(30) Foreign Application Priority Data

Feb. 14, 2007 (KR) .................. 10-2007-0015632

(51) Int. Cl.
*G06F 3/038* (2006.01)
*G09G 5/00* (2006.01)
*G09G 3/36* (2006.01)
(52) U.S. Cl. ............. 345/213; 345/92; 345/98; 345/204
(58) Field of Classification Search .................... 345/87, 345/99, 213
See application file for complete search history.

(56) References Cited

U.S. PATENT DOCUMENTS

| | | | |
|---|---|---|---|
| 5,247,289 A * | 9/1993 | Matsueda | 345/98 |
| 5,850,216 A | 12/1998 | Kwon | |
| 6,380,919 B1 * | 4/2002 | Koyama et al. | 345/92 |
| 6,894,667 B1 | 5/2005 | Lin | |
| 2004/0207612 A1 * | 10/2004 | Moon | 345/204 |
| 2006/0017686 A1 * | 1/2006 | Park | 345/100 |

FOREIGN PATENT DOCUMENTS

| | | |
|---|---|---|
| CN | 1167967 | 12/1997 |
| CN | 1790473 A | 6/2006 |
| EP | 0875879 A1 | 11/1998 |
| JP | 02216120 A | 8/1990 |
| JP | 09-152574 A | 6/1997 |

OTHER PUBLICATIONS

C.R. Kagan & P. Andry (Edition) 2003 "Thin-Film Transistors" Marcel Dekker, Inc., USA XP002538345 pp. 269-277.
International Search Report dated Aug. 11, 2009.
Willem Den Boer: "Active Matrix Liquid Crystal Displays: Fundamentals and Applications", 2005, XP040426102, USA, ISBN: 0750678135, 8 pages.

* cited by examiner

*Primary Examiner* — Alexander S Beck
*Assistant Examiner* — Charles V Hicks
(74) *Attorney, Agent, or Firm* — Innovation Counsel LLP (57) ABSTRACT

A display device includes driving apparatus having first, second, third, and fourth gate drivers. The first and second gate drivers are connected to gate lines and are positioned on one side of the display device side by side. The third and fourth gate drivers are connected to gate lines and are positioned on the other side of the display device side by side. The first and third gate drivers apply the gate signal to the same gate line, and the second and fourth gate drivers apply the gate signal to the same gate line.

16 Claims, 7 Drawing Sheets

FIG. 6

DRIVING APPARATUS OF DISPLAY DEVICE AND DISPLAY DEVICE INCLUDING THE SAME

CROSS-REFERENCE TO RELATED APPLICATION

This application claims priority to and the benefit of Korean Patent Application No. 10-2007-0015632 filed in the Korean Intellectual Property Office on Feb. 14, 2007, the entire contents of which are incorporated herein by reference.

BACKGROUND OF THE INVENTION

1. Field of the Invention

The present invention relates to a driver and a display device including the driver.

2. Description of the Related Art

Generally, a liquid crystal display (LCD) includes a pair of display panels including pixel electrodes, a common electrode, and a liquid crystal layer with dielectric anisotropy interposed between the panels. The pixel electrodes are arranged in the form of a matrix, and are connected to switching elements such as thin film transistors (TFTs) to sequentially receive data signals per pixel row. The common electrode that receives a common voltage extends over substantially the entire surface of one of the panels. From a circuit perspective, the pixel and common electrodes and the liquid crystal layer disposed therebetween form a liquid crystal capacitor. The liquid crystal capacitor together with a switching element connected thereto form a basic unit for a pixel.

Voltages to the two panels generate electrical fields in the liquid crystal layer that vary the transmittance of light passing through the liquid crystal layer, thereby displaying desired images. In order to prevent the liquid crystal layer from deteriorating due to extended application of a unidirectional electrical field, the voltage polarity of the data signal with respect to the common voltage is periodically inverted, e.g., per frame, per pixel row, or per pixel.

The LCD includes a gate driver for transmitting a gate signal to a gate line for turning on/off the switching element of a pixel. The LCD also includes a gray voltage generator for generating a plurality of gray voltages, a data driver for selecting a voltage corresponding to image data among the gray voltages, and a signal controller.

The gate driver is formed in the same manufacturing process as the switching element and is integrated with the display panel. The pixels are disposed in a horizontal direction to increase the number of gate lines by three times and decrease the number of data lines to be ⅓, the cost may be reduced while realizing the same resolution. In addition, according to the increased number of the gate lines, the gate driver may be provided at the right and left sides of the display panel to permit alternately application of the gate signal.

However, the pixel charging rates may differ between a side that is adjacent to the gate driver and a side that is far from the gate driver because of a resistor-capacitor (RC) delay. Thus, pixel voltages applied to the pixel may differ, and neighboring pixels may have different brightnesses even when the data voltage indicating the same brightness is input.

Since it is required to alternately apply the gate signals from the two gate drivers positioned at right and left sides of the display panel, it is difficult to simultaneously apply the gate signals, particularly for a small and medium sized display device.

SUMMARY OF THE INVENTION

According to an exemplary embodiment of the invention, a display includes a driver for applying gate signals to gate lines connected to a plurality of pixels includes first, second, third, and fourth gate drivers. The first and second gate drivers are connected to the gate lines and are positioned on one side of the display device, side by side. The third and fourth gate drivers are connected to the gate lines and are positioned on the other side of the display device, side by side. The first and third gate drivers apply the gate signals to the same gate line, and the second and fourth gate drivers apply the gate signals to the same gate line.

The first and third gate drivers may be connected to even-numbered gate lines among the gate lines, and the second and fourth gate drivers may be connected to odd-numbered gate lines among the gate lines.

In addition, the first to fourth gate drivers may be connected to each other, they respectively may include a plurality of stages for generating the gate signals and applying them to the gate lines, and a vertical width of one stage may be greater than a vertical width of one pixel.

Further, a first stage in the first gate driver and a second stage in the second gate driver may be disposed side by side, and a third stage in the third gate driver and a fourth stage in the fourth gate driver may be disposed side by side.

Two pixels neighboring in a column direction among the pixels may be positioned between the two neighboring gate lines.

The first to fourth stages may generate the gate signals based on first and fourth clock signals and apply them to the gate lines, the first and third stages may receive second and fourth clock signals, and the second and fourth stages may receive the first and third clock signals.

The first to fourth stages may receive a gate-off voltage and an initialization signal, and the first to fourth stages may respectively include a set terminal, a gate voltage terminal, first and second clock terminals, a reset terminal, a frame reset terminal, and a gate output terminal, and a carry output terminal.

The set terminal may receive an output of a previous stage, the gate voltage terminal may receive the gate-off voltage, the first and second clock terminals may receive one of the first to fourth clock signals, the reset terminal may receive an output of a next stage, and the frame reset terminal may receive the initialization signal.

The first to fourth stages may be integrated with the display device.

An exemplary display device including a display panel including gate lines respectively connected to a plurality of pixels includes first, second, third, and fourth gate drivers. The first and second gate drivers are connected to the gate lines and are positioned on one side of the display device side by side. The third and fourth gate drivers are connected to the gate lines and are positioned on the other side of the display device side by side. The first and third gate drivers are connected to the same gate line, and the second and fourth gate drivers are connected to the same gate line.

In this case, the first and third gate drivers may be connected to even-numbered gate lines among the gate lines, and the second and fourth gate drivers may be connected to odd-numbered gate lines among the gate lines.

The first to fourth gate drivers may be connected to each other, they may respectively include a plurality of stages for generating the gate signals and applying them to the gate lines, and a vertical width of one stage may be greater than a vertical width of one pixel.

A first stage in the first gate driver and a second stage in the second gate driver may be disposed side by side, and a third stage in the third gate driver and a fourth stage in the fourth gate driver may be disposed side by side.

Two pixels neighboring in a column direction among the pixels may be positioned between the two neighboring gate lines.

The first to fourth stages may generate the gate signal based on first and fourth clock signals and apply it to the gate line, the first and third stages receive the second and fourth clock signals, and the second and fourth stages receive the first and third clock signals.

The first to fourth stages may receive a gate-off voltage and an initialization signal, and the first to fourth stages may respectively include a set terminal, a gate voltage terminal, first and second clock terminals, a reset terminal, a frame reset terminal, a gate output terminal, and a carry output terminal.

The set terminal may receive an output of a previous stage, the gate voltage terminal may receive the gate-off voltage, the first and second clock terminals may receive one of the first to fourth clock signals, the reset terminal may receive an output of a next stage, and the frame reset terminal may receive the initialization signal.

The first to fourth stages may be integrated with the display panel.

BRIEF DESCRIPTION OF THE DRAWINGS

The accompanying drawings briefly described below illustrate exemplary embodiments of the present invention and, together with the description, serve to explain the principles of the present invention.

DETAILED DESCRIPTION OF THE EMBODIMENTS

The present invention will be described more fully hereinafter with reference to the accompanying drawings, in which exemplary embodiments of the invention are shown.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A display device according to an exemplary embodiment of the present invention will be described with reference to FIG. 1 and FIG. 2, and a liquid crystal display will be exemplified to describe the display device.

Figure 1:
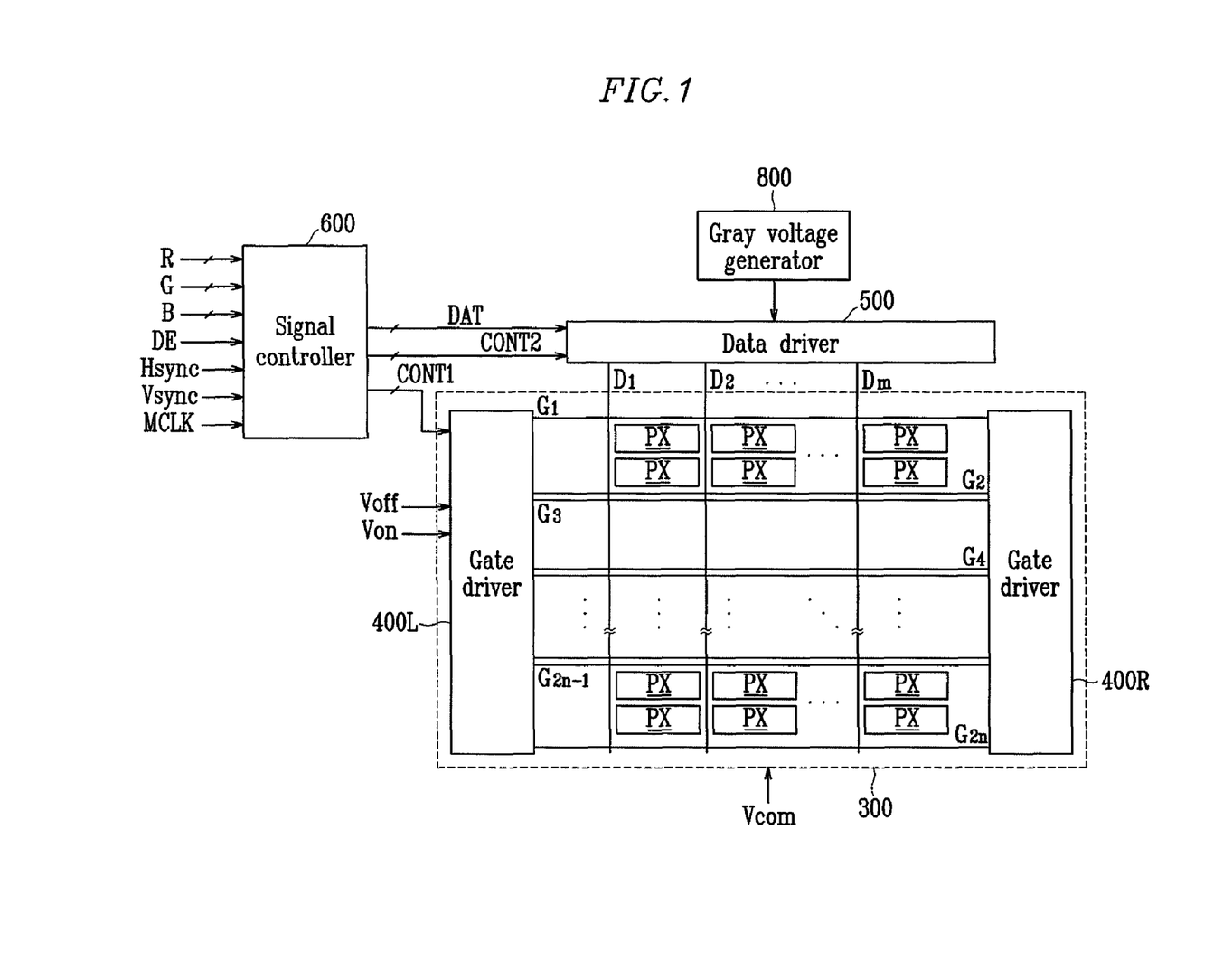
FIG. 1 is a block diagram of a liquid crystal display according to an exemplary embodiment of the present invention.
Figure 2:
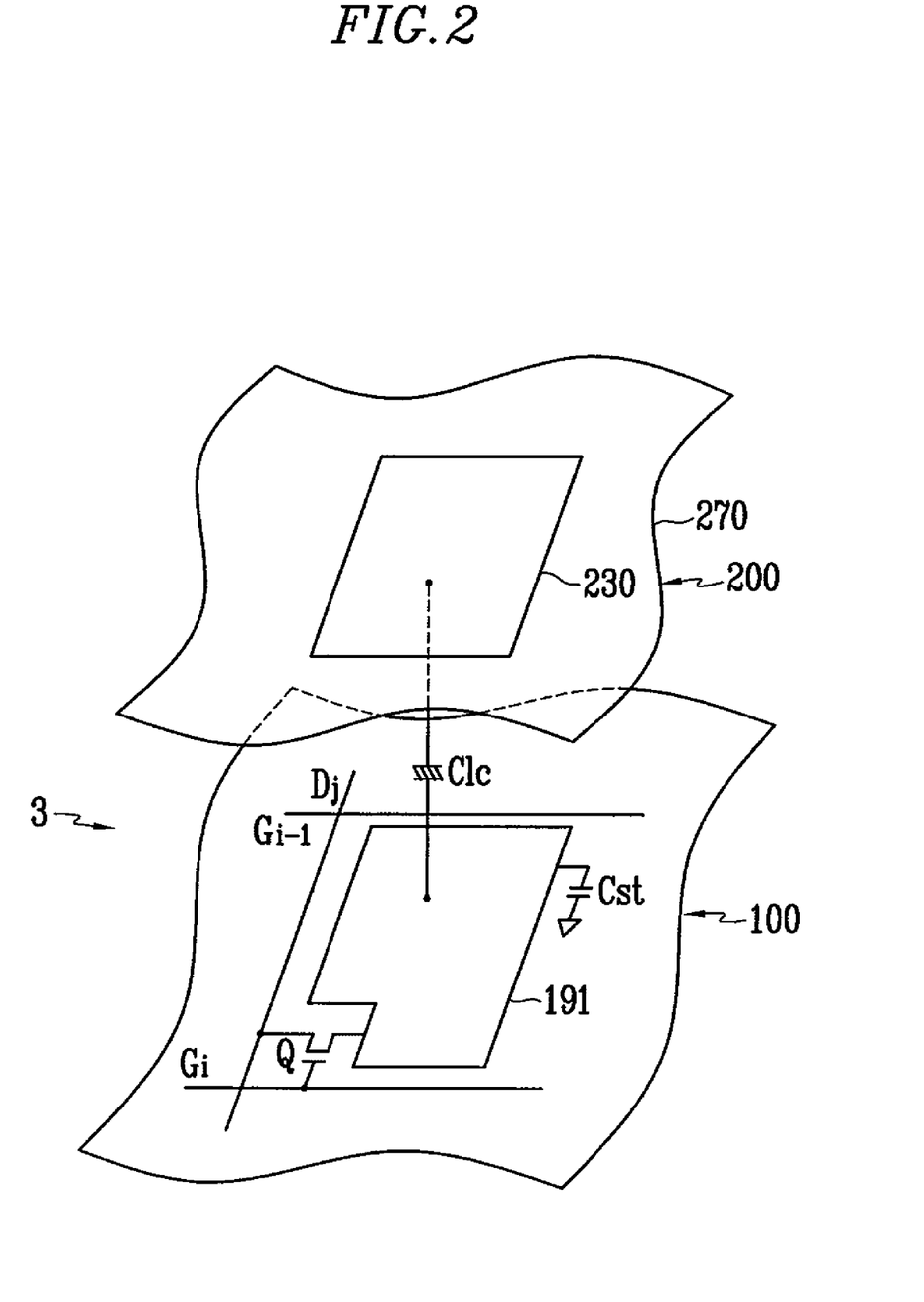
FIG. 2 is an equivalent circuit diagram of one pixel of the liquid crystal display according to the exemplary embodiment of the present invention.

FIG. 1 is a block diagram of a liquid crystal display according to the exemplary embodiment of the present invention, and FIG. 2 is an equivalent circuit diagram of one pixel of the liquid crystal display according to the exemplary embodiment of the present invention.

As shown in FIG. 1, the liquid crystal display according to the exemplary embodiment of the present invention includes a liquid crystal panel assembly 300, gate drivers 400L and 400R and a data driver 500 connected to the liquid crystal panel assembly 300, a gray voltage generator 800 connected to the data driver 500, and a signal controller 600 for controlling them.

In terms of an equivalent circuit, the liquid crystal panel assembly 300 includes a plurality of signal lines $G_1$ to $G_{2n}$ and $D_1$ to $D_m$ and a plurality of pixels PX connected with the plurality of signal lines $G_1$ to $G_{2n}$ and $D_1$ to $D_m$ and arranged substantially in a matrix form.

The signal lines $G_1$ to $G_{2n}$ and $D_1$ to $D_m$ include a plurality of gate lines $G_1$ to $G_{2n}$ for transferring gate signals (also referred to as scan signals)), and a plurality of data lines $D_1$ to $D_m$ for transferring data signals. The gate lines $G_1$ to $G_{2n}$ extend substantially in a row direction and are substantially parallel to each other, and the data lines $D_1$ to $D_m$ extend substantially in a column direction and are substantially parallel to each other.

Each pixel PX includes a switching element Q connected to the signal lines $G_1$ to $G_{2n}$ and $D_1$ to $D_m$, and a liquid crystal capacitor Clc and a storage capacitor Cst connected thereto. The storage capacitor Cst can be omitted as necessary.

The switching element Q as a three-terminal element such as a thin film transistor (TFT) is provided on a lower panel 100, which includes a control terminal connected with the gate lines $G_1$ to $G_{2n}$, an input terminal connected with the data lines $D_1$ to $D_m$, and an output terminal connected with the liquid crystal capacitor Clc and the storage capacitor Cst.

The liquid crystal capacitor Clc has a pixel electrode 191 of the lower panel 100 and a common electrode 270 of a upper panel 200 as two terminals, and the liquid crystal layer 3 between the two electrodes 191 and 270 serves as a dielectric material. The pixel electrode 191 is connected with the switching element Q, and the common electrode 270 is formed on the entire surface of the upper panel 200 and receives a common voltage Vcom. Differing from the case as shown in FIG. 2, the common electrode 270 can be provided on the lower panel 100, and in this case, at least one of the two electrodes 191 and 270 can be formed in a linear or bar shape.

The storage capacitor Cst that functions as an auxiliary to the liquid crystal capacitor Clc is formed by overlapping a separate signal line (not shown) provided on the lower panel 100 and the pixel electrode 191 while having an insulator between the separate signal line and the pixel electrode 191, and a predetermined voltage such as the common voltage Vcom or the like is applied to the separate signal line. Also, the storage capacitor Cst can be formed as the pixel electrode 191 overlaps with the immediately previous gate line by the medium of the insulator.

In order to implement color display, each pixel PX specifically displays one of the primary colors (spatial division) or pixels PX alternately display the primary colors over time (temporal division), so that a desired color can be recognized by the spatial or temporal sum of the primary colors. The primary colors can be, for example, three primary colors of red, green, and blue. FIG. 2 shows one example of the spatial division in which each pixel PX includes a color filter 230 that displays one of the primary colors at a region of the upper panel 200 corresponding to the pixel electrode 191. Different from the color filter 230 as shown in FIG. 2, the color filter 230 can be formed above or below the pixel electrode 191 of the lower panel 100.

At least one polarizer (not shown) for polarizing light is attached on an outer surface of at least one of the two display panels 100 and 200.

The gray voltage generator 800 generates two sets of gray voltages (or a set of reference gray voltages) related to transmittance of the pixels PX. One of the two sets of the gray voltages has a positive value and the other has a negative value with respect to the common voltage Vcom A pair of gate drivers 400L and 400R are respectively provided on right and left sides of the liquid crystal panel assembly 300, respectively connected to odd-numbered gate lines $G_1, G_3, \ldots,$ and $G_{2n-1}$ and even-numbered gate lines $G_2$, $G_4, \ldots,$ and $G_{2n}$), and apply gate signals formed by a combination of a gate-on voltage Von and a gate-off voltage Voff to the gate lines $G_1$ to $G_{2n}$. The gate drivers 400L and 400R include a plurality of stages. The stages are substantially shift registers, and are arranged in a line. The gate drivers 400L and 400R are formed in the same manufacturing steps as the switching element Q of the pixel PX. In addition, the gate drivers 400L and 400R may be mounted as integrated circuits (ICs).

The data driver 500 is connected to the data lines $D_1$ to $D_m$ of the liquid crystal panel assembly 300, and selects gray voltages from the gray voltage generator 800 to apply them as data signals to the data lines $D_1$ to $D_m$. However, in a case where the gray voltage generator 800 does not provide respective voltages for all the gray scales but only provides a predetermined number of reference gray voltages, the data driver 500 divides the reference gray voltages to generate additional gray voltages for all gray scale and selects data signals from among them.

The signal controller 600 controls the gate drivers 400L and 400R and the data driver 500.

Each of the drivers 500, 600, and 800 may be directly mounted as at least one integrated circuit (IC) chip on the liquid crystal panel assembly 300 or on a flexible printed circuit film (not shown) in a tape carrier package (TCP) type, which are attached to the liquid crystal panel assembly 300, or may be mounted on an additional printed circuit board (not shown). Alternatively, the drivers 500, 600, and 800 may be integrated with the panel assembly 300 along with the signal lines $G_1$ to $G_{2n}$ and $D_1$ to $D_m$ and the switching elements Q. Further, the drivers 500, 600, and 800 may be integrated as a single chip. In this case, at least one of them or at least one circuit device constituting them may be located outside the single chip.

The operation of the liquid crystal display will now be described in detail.

The signal controller 600 receives input image signals R, G, and B and input control signals for controlling the display thereof from an external graphics controller (not shown). The input control signals may include a vertical synchronization signal Vsync, a horizontal synchronization signal Hsync, a main clock signal MCLK, and a data enable signal DE.

After generating gate control signals CONT1 and data control signals CONT2 and processing the image signals R, G, and B to be suitable for the operation of the panel assembly 300 on the basis of the input control signals and the input image signals R, G, and B, the signal controller 600 provides the gate control signals CONT1 for the gate driver 400, and the processed image signals DAT and the data control signals CONT2 for the data driver 500.

The gate control signal CONT1 includes a scan start signal STV for starting a scan operation, and at least one clock signal for controlling an output period of a gate-on voltage Von. Further, the gate control signal CONT1 may include an output enable signal OE for defining the duration of the gate-on voltage Von.

The data control signals CONT2 include a horizontal synchronization start signal STH for controlling the start of data transmission for a row (or a group) of pixels, a load signal LOAD for applying the data signals to the data lines $D_1$-$D_m$, and a data clock signal HCLK. The data control signal CONT2 may further include an inversion signal RVS for inverting the polarity of the voltages of the data signals with respect to the common voltage Vcom (hereinafter, "the polarity of the voltages of the data signals with respect to the common voltage" is abbreviated as "the polarity of the data signals").

In response to the data control signals CONT2 from the signal controller 600, the data driver 500 receives digital image signals DAT for a row (or a group) of pixels from the signal controller 600, converts the digital image signals DAT into analog data signals by selecting gray voltages corresponding to the respective digital image signals DAT, and applies the digital image signals DAT to the data lines $D_1$-$D_m$.

The gate drivers 400L and 400R apply the gate-on voltage Von to the gate lines $G_1$ to $G_{2n}$ in response to the gate control signals CONT1 from the signal controller 600, so as to turn on the switching elements Q connected thereto. Thereby, the data voltages applied to the data lines D1-Dm are supplied to the pixels PX through the turned-on switching elements Q.

The difference between the voltage of the data signal applied to a pixel PX and the common voltage Vcom is expressed as the charge voltage of the LC capacitor Clc, i.e., a pixel voltage. The liquid crystal molecules have orientations depending on magnitude of the pixel voltage to change the polarization of light passing through the liquid crystal layer 3. The change of the polarization is converted into a change of light transmittance by the polarizer attached to the liquid crystal panel assembly 300.

The above operation is repeatedly performed over a unit of a horizontal period 1H corresponding to one period of the horizontal synchronization signal Hsync and the data enable signal DE, such that the gate-on voltage Von is sequentially applied to all the gate lines G1 to Gn and the data voltage is applied to all the pixels, so as to display an image of one frame.

After one frame ends, a subsequent frame is started, and the state of the inversion signal RVS applied to the data driver 500 to invert the polarity of the data voltage applied to each pixel PX from the polarity in a previous frame is controlled, which is referred to as a "frame inversion". In a frame, the polarity of the data voltage flowing through one data line may be periodically changed according to characteristics of the inversion signal RVS (e.g., row inversion and dot inversion), or the polarities of the data voltage applied to one pixel row may be different. (e.g., column inversion and dot inversion).

The gate driver according to the exemplary embodiment of the present invention will be described with reference to FIG. 3A to FIG. 6.

Figure 3A:
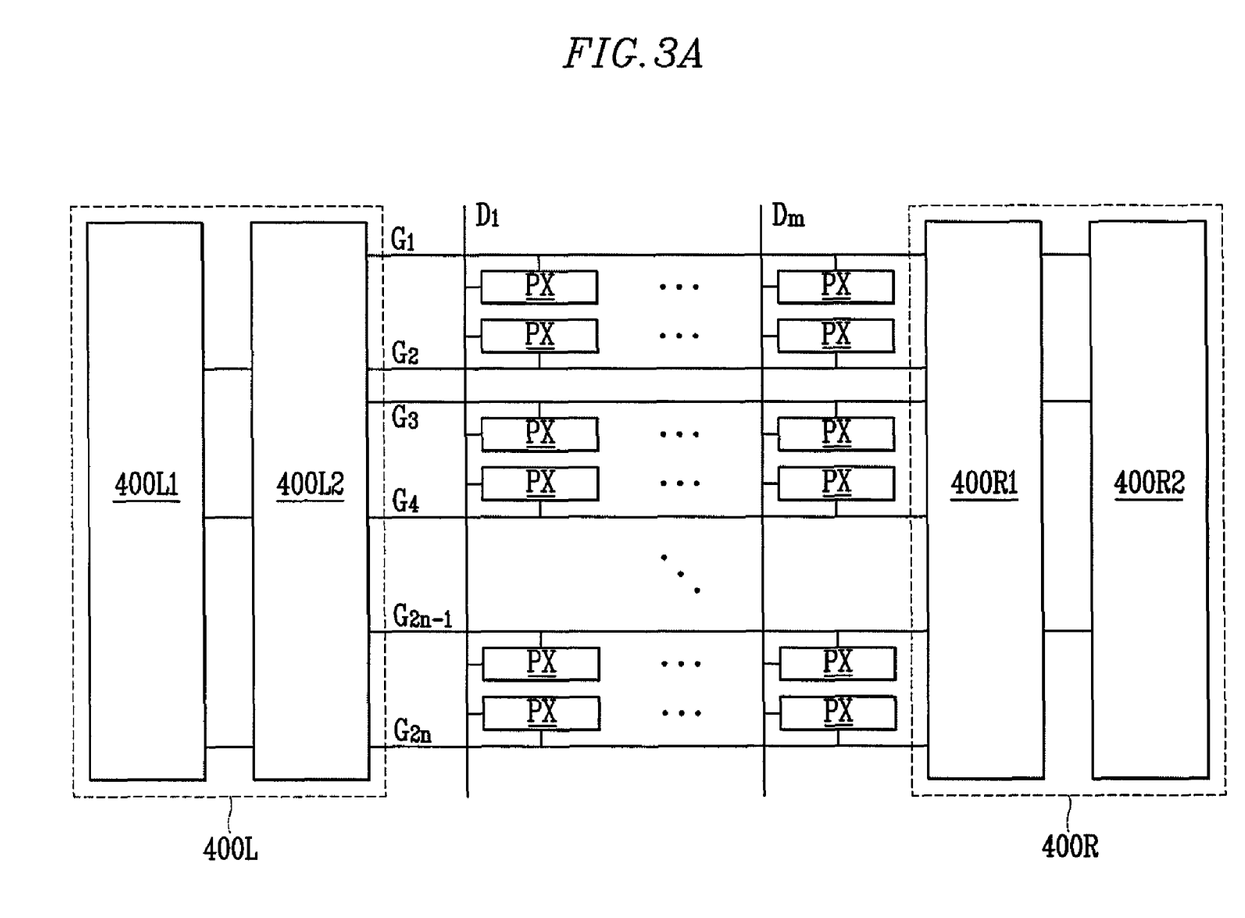
FIG. 3A is a block diagram of a gate driver shown in FIG. 1.
Figure 3B:
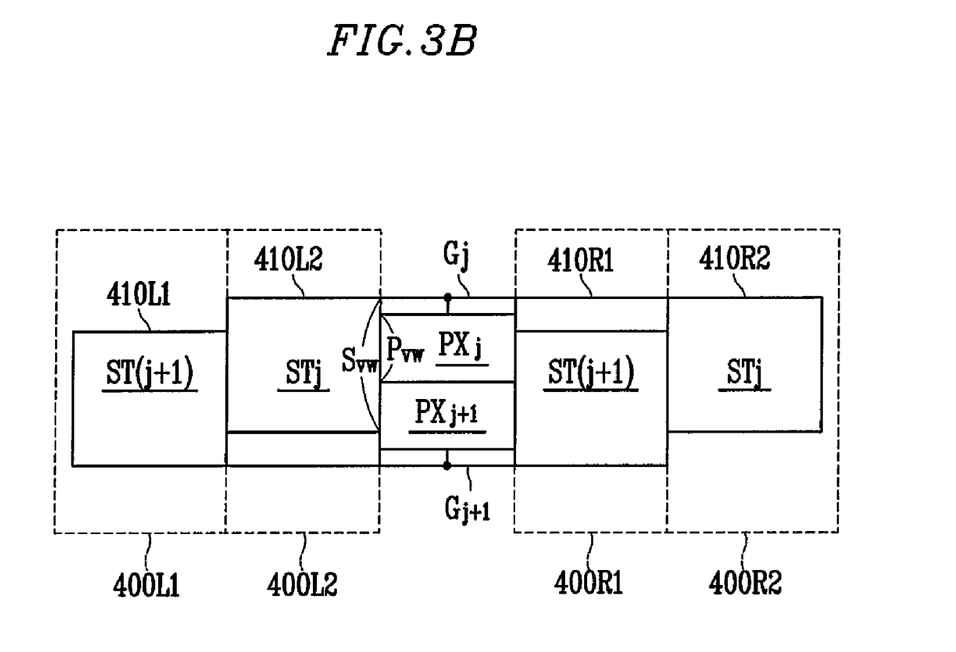
FIG. 3B is a block diagram representing a part of stages forming the gate driver shown in FIG. 3A.
Figure 4:
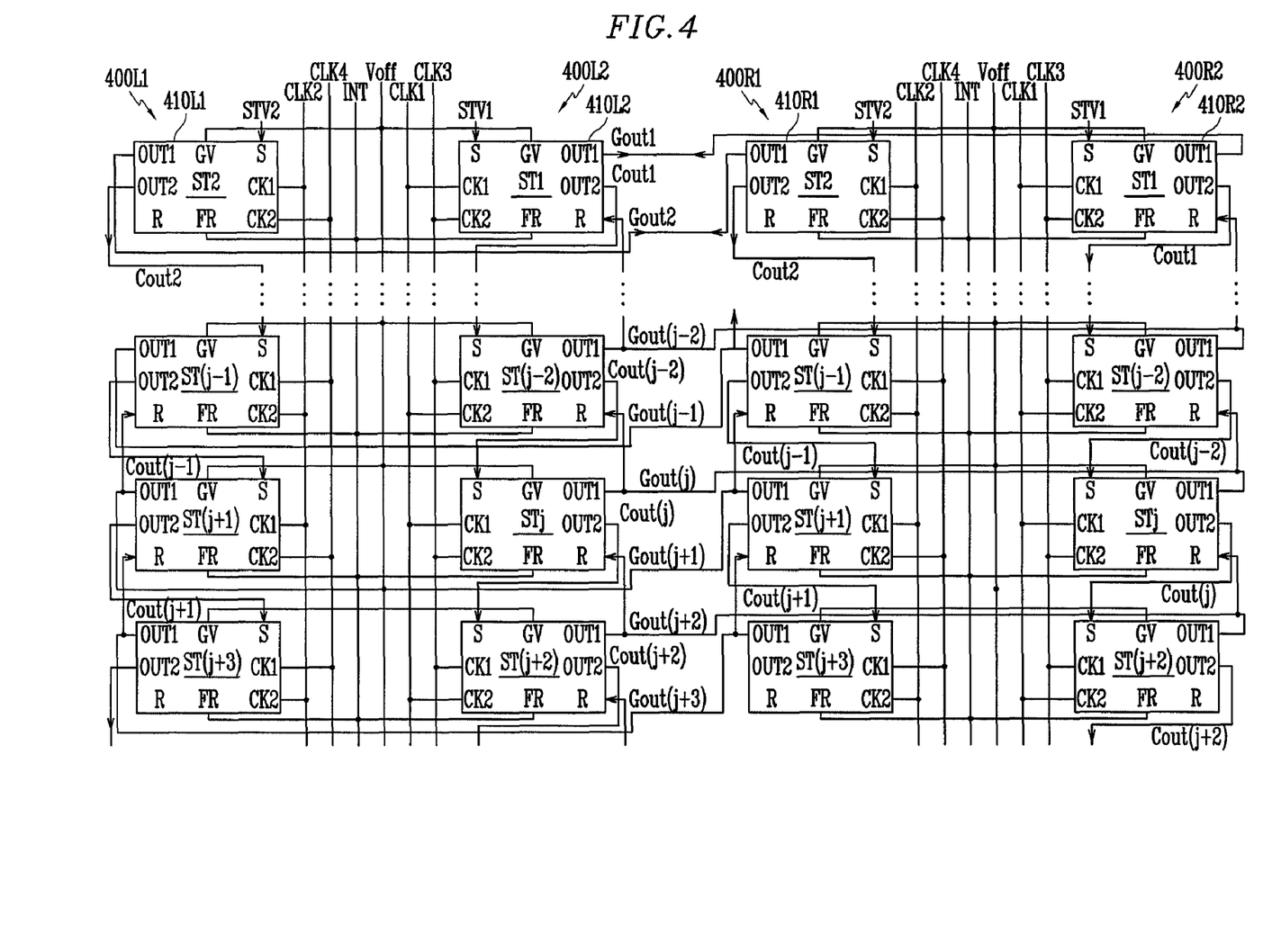
FIG. 4 is a detailed block of the gate driver according to the exemplary embodiment of the present invention.
Figure 5:
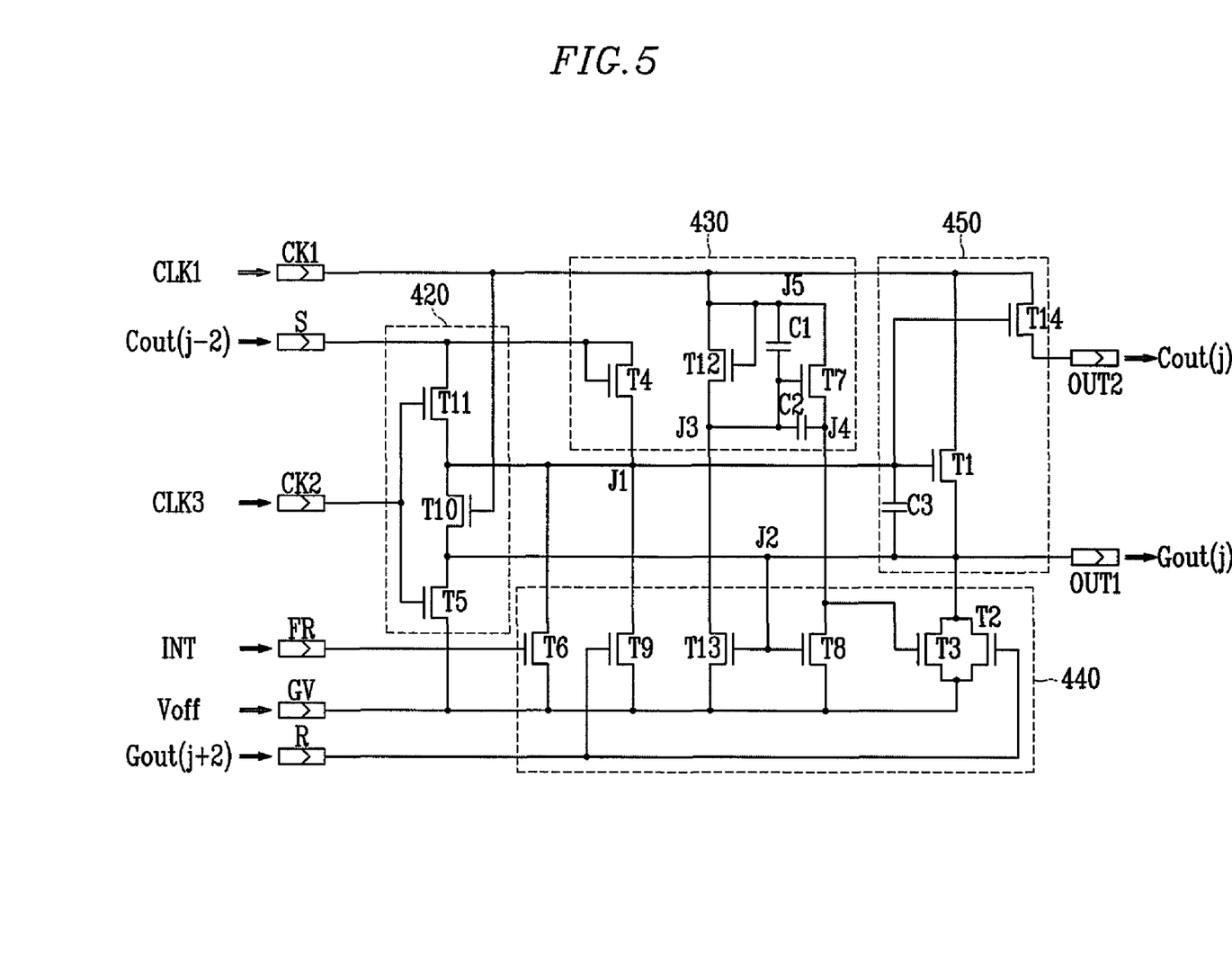
FIG. 5 is a circuit diagram illustrating a $t^h$ stage of a shift register for the gate driver according to the exemplary embodiment of the present invention.
Figure 6:
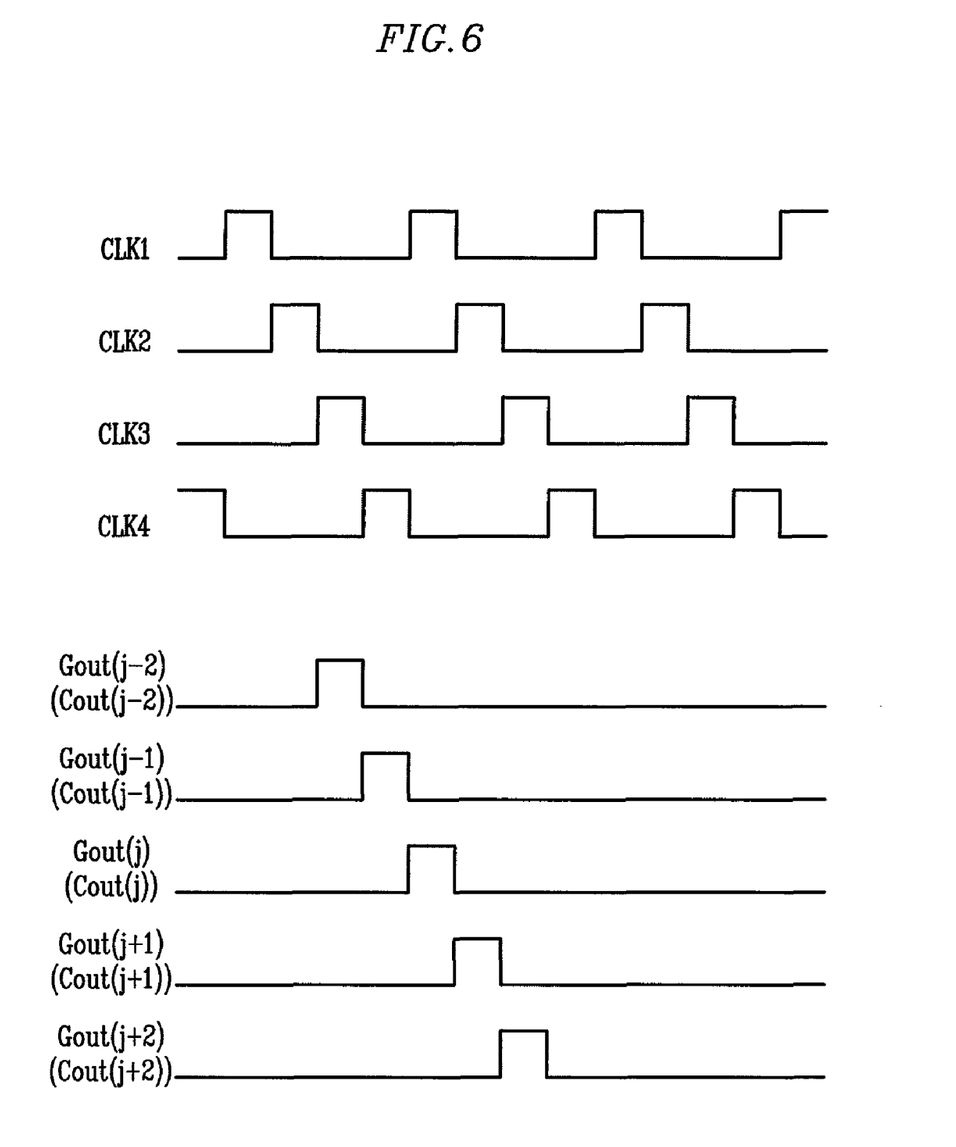
FIG. 6 is a signal waveform diagram of the gate driver shown in FIG. 4.

FIG. 3A is a block diagram of the gate driver shown in FIG. 1, and FIG. 3B is a block diagram representing part of the stages forming the gate driver shown in FIG. 3A. FIG. 4 is a detailed block of the gate driver according to the exemplary embodiment of the present invention, FIG. 5 is a circuit diagram illustrating a j-th stage of a shift register for the gate driver according to the exemplary embodiment of the present invention, and FIG. 6 is a signal waveform diagram of the gate driver shown in FIG. 4.

The gate drivers 400L and 400R shown in FIG. 3A respectively include a pair of gate drivers 400L1 and 400L2, and 400R1 and 400R2.

In this case, among the pair of gate drivers 400L1 and 400L2 that are positioned at the left, the first gate driver 400L1 is connected to the even-numbered gate lines $G_2$, $G_4$, ..., and $G_{2n}$, and the second gate driver 400L2 is connected to the odd-numbered gate lines $G_1$, $G_3$, ..., and $G_{2n-1}$. In a like manner, among the pair of gate drivers 400R1 and 400R2 that are positioned at the right, the third gate driver 400R1 is connected to the even-numbered gate lines $G_2$, $G_4$, ..., and $G_{2n}$, and the fourth gate driver 400R2 is connected to the odd-numbered gate lines $G_1$, $G_3$, ..., and $G_{2n-1}$. That is, the first and third gate drivers 400L1 and 400R1 are commonly connected to the even-numbered gate lines $G_2$, $G_4$, ..., and $G_{2n}$, and the second and fourth gate drivers 400L2 and 400R2 are commonly connected to the odd-numbered gate lines $G_1$, $G_3$, ..., and $G_{2n-1}$.

In addition, as shown in FIG. 3B, the gate drivers 400L1, 400L2, 400R1, and 400R2 are respectively arranged in a row, and respectively include a plurality of stages 410L1, 410L2, 410R1, and 410R2 respectively connected to the gate lines. In FIG. 3B, $j^{th}$ and $(j+1)^{th}$ stages STj and ST(j+1) are exemplified (here, j is an odd number).

Two pixels $PX_j$ and $PX_{j+1}$ neighboring in a column direction are positioned between the two neighboring gate lines $G_j$ and $G_{j+1}$, the odd-numbered pixel $PX_j$ among the two pixels $PX_j$ and $PX_{j+1}$ is connected to the upper gate line $G_j$, and the even-numbered pixel $PX_{j+1}$ is connected to the lower gate line $G_{j+1}$.

Each vertical width Pvw of the pixels $PX_j$ and $PX_{j+1}$ is less than the each vertical width Svw of the stages STj and ST(j+1), and a sum of the vertical widths of two pixels is similar to the vertical width of one stage. For example, the vertical width Pvw of the one pixel $PX_j$ are approximately 60 μm, and the vertical width Svw of one stage is 115 μm. That is, Svw≈2×Pvw.

A gate-off voltage Voff, an initialization signal INT, first and second scanning start signals STV1 and STV2, and first to fourth clock signals CLK1, CLK2, CLK3, and CLK4 are input to the gate drivers 400L1, 400L2, 400R1, and 400R2 shown in FIG. 4.

The first to fourth clock signals CLK1, CLK2, CLK3, and CLK4 respectively have a duty ratio of 25% and a 4H cycle, and they sequentially have a phase difference of 90°.

In addition, the stages connected to the same gate line receive the same signal, and therefore they are simultaneously driven. For example, the first and third gate drivers 400L1 and 400R1 receive the second and fourth clock signals CLK2 and CLK4, and the second and fourth gate drivers 400R2 and 400L2 receive the first and third clock signals CLK1 and CLK3.

For better comprehension and ease of description, the first and second gate drivers 400L1 and 400L2 will be described as an example, which may be applied to the third and fourth gate drivers 400R1 and 400R2.

To drive the switching element Q of the pixel PX, the clock signals CLK1, CLK2, CLK3, and CLK4 are respectively gate-on voltages Von when they are high levels, and they are respectively gate-off voltage Voff when they are low levels.

The respective stages 410L1 and 410L2 include a set terminal S, a gate voltage terminal GV, a pair of clock terminals CK1 and CK2, a reset terminal R, a frame reset terminal FR, a gate output terminal OUT1, and a carry output terminal OUT2.

In each stage 410, for example, a carry output of a previous stage ST(j−2) (i.e., a previous-stage carry output Cout(j−2)) is input to the set terminal S of a $j^{th}$ stage STj. A gate output of a next stage ST(j+2) (i.e., a next-stage gate output Gout(j+2)) is input to the reset terminal R of the $j^{th}$ stage STj. The clock signals CLK1 and CLK3 are input to the clock terminals CK1 and CK2. The gate-off voltage Voff is input to the gate voltage terminal GV. The gate output terminal OUT1 outputs the gate output Gout(j), and the carry output terminal OUT2 outputs the carry output Cout(j).

Rather than outputting the previous carry output, the scanning start signals STV2 and STV1 are input to first stages ST2 and ST1 of the respective gate drivers 400L1 and 400L2. In addition, when the first clock signal CLK1 is input to the clock terminal CK1 of the j-th stage STj and the third clock signal CLK2 is input to the clock terminal CK2, the third clock signal CLK3 and the first clock signal CLK1 are respectively input to the clock terminals CK1 and CK2 of the (j−2)-th and (j+2)-th stages ST(j−2) and ST(j+2)] neighboring the j-th stage STj.

As shown in FIG. 5, the gate drivers 400L1 and 400L2 of the j-th stage according to the exemplary embodiment of the present invention include an input section 420, a full-up driver 430, a full-down driver 440, and an output unit 450, which include at least one n-channel metal oxide semiconductor (NMOS) transistors T1 to T14. The full-up driver 430 and the output unit 450 further include capacitors C1 to C3. Rather than using the NMOS transistor, a p-channel metal oxide semiconductor (PMOS) transistor may be used. In addition, the capacitors C1 to C3 may be substantially parasitic capacitance between a gate and a drain/source formed in the manufacturing process.

The input section 420 includes three transistors T11, T10, and T5 sequentially coupled to the set terminal S and the gate voltage terminal GV in series. Gates of the transistors T11 and T5 are connected to the clock terminal CK2, and a gate of the transistor T10 is connected to the clock terminal CK1. A node between the transistor T11 and the transistor T10 is connected to a node J1, and a node between the transistor T10 and the transistor T5 is connected to a node J2.

The full-up driver 430 includes the transistor T4 connected between the set terminal S and the node J1, the transistor T12 connected between the clock terminal CK1 and a node J3, and the transistor T7 connected between the clock terminal CK1 and a node J4. A gate and a drain of the transistor T4 are commonly connected to the set terminal S, and a source thereof is connected to the node J1. A gate and a drain of the transistor T12 are commonly connected to the clock terminal CK1, and a source thereof is connected to the node J3. A gate of the transistor T7 is connected to the node J3 and is connected to the clock terminal CK1 through the capacitor C1, and a source thereof is connected to the node J4. The capacitor C2 is connected between the node J3 and the node J4.

The full-down driver 440 includes a plurality of transistors T6, T9, T13, T8, T3, and T2 for receiving the gate-off voltage Voff through a source and outputting it to the nodes J1, J2, J3, and J4 through a drain. A gate of the transistor T6 is connected to the frame reset terminal FR, a drain thereof is connected to the node J1, a gate of the transistor T9 is connected to the reset terminal R, a drain thereof is connected to the node J1, gates of the transistors T13 and T8 are commonly connected to the node J2, and drains thereof are respectively connected to the nodes J3 and J4. A gate of the transistor T3 is connected to the node J4, a gate of the transistor T2 is connected to the reset terminal R, and drains of the transistors T3 and T2 are connected to the node J2.

The output unit 450 includes a pair of transistors T1 and T14 including a drain and a source connected between the clock terminal CK1 and the output terminals OUT1 and OUT2 and a gate connected to the node J1, and the capacitor C3 connected between the gate and the drain of the transistor T1 (i.e., between the node J1 and the node J2). The source of the transistor T1 is connected to the node J2.

The operation of the stage will be described while the j-th stage STj is exemplified.

For better comprehension and ease of description, the voltage corresponding to a high level of the clock signals CLK1 and CLK3 will be referred to as a high voltage, and the voltage corresponding to a low level will be referred to as a low voltage.

When the third clock signal CLK3 and the previous-stage carry output Cout(j−2) become high, the transistors T11 and T5 and the transistor T4 are turned on. Then, the two transistors T11 and T4 transmit the high voltage to the node J1, and the transistor T5 transmits the low voltage to the node J2. Accordingly, the first clock signal CLK1 is output to the output terminals OUT1 and OUT2 since the transistors T1 and T14 are turned on. Since the voltage at the node J2 and the first clock signal CLK1 are the low voltages, the output voltages Gout(j) and Cout(j) become the low voltages. In addition, the capacitor C3 is charged with a voltage corresponding to a difference between the high voltage and the low voltage.

Since the first clock signal CLK1 and the next-stage gate output Gout(j+2) and the node J2 are the low voltages, the transistors T10, T9, T12, T13, T8, and T2 including gates connected thereto are turned off.

The transistors T11 and T5 are turned off when the third clock signal CLK3 becomes low, and the output voltage of the transistor T1 and the voltage at the node J2 are the high voltage when the first clock signal CLK1 becomes high. The high voltage is applied to the gate of the transistor T10, but the potential of the source connected to the node J2 is the high voltage. Therefore the potential difference between the gate and the source is zero, and the transistor T10 is maintained on. Accordingly, the node J1 is floated, and the potential is increased by the high voltage by the capacitor C3.

Since the potentials of the first clock signal CLK1 and the node J2 are the high voltage, the transistors T12, T13, and T8 are turned on. The transistor T12 and the transistor T13 are connected in series between the high voltage and the low voltage, and therefore the potential of the node J3 has a voltage divided by the resistance when the transistors T12 and T13 are turned on. However, if the resistance when the two transistors are turned on is set to be considerably higher than the resistance when the transistor T12 is turned on (for example, approximately 10,000 times), the voltage at the node J3 is almost the same as the high voltage. Accordingly, the transistor T7 is turned on to be connected in series to the transistor T8, and the potential at the node J4 has a voltage divided by the resistance when the two transistors T7 and T8 are turned on. When the resistances of the two transistors T7 and T8 are set to be the same, the potential of the node J4 has an intermediate value between the high voltage and the low voltage, and therefore the transistor T3 is maintained to be turned off. Since the next-stage gate output Gout(j+2) is still low, the transistors T9 and T2 are maintained to be turned off. Accordingly, the output terminals OUT1 and OUT2 are connected to the first clock signal CLK1, and are interrupted with the low voltage to output the high voltage.

In addition, the capacitors C1 and C2 are respectively charged with voltages corresponding to potential differences between both terminals, and the voltage at the node J3 is lower than a voltage at a node J5.

When the next-stage gate output Gout(j+2) and the third clock signal CLK3 become high and the first clock signal CLK1 becomes low, the transistors T9 and T2 are turned on to output the low voltage to the nodes J1 and J2. The voltage at the node J1 is reduced to be the low voltage while the capacitor C3 is discharged, and it takes time to reduce the voltage at the node J1 to the low voltage due to a discharge time of the capacitor C3. Accordingly, the transistors T1 and T14 are maintained to be turned off for a while after the next-stage gate output Gout(j+2) becomes high, and therefore output terminals OUT1 and OUT2 are connected to the first clock signal CLK1 to output the low voltage. Since the output terminal OUT2 is disconnected with the first clock signal CLK1 since the transistor T14 is turned off when the capacitor C3 is completely discharged and the potential at the node J1 reaches the low voltage, the carry output Cout(j) is floated and maintained to be in the low voltage. At the same time, since the output terminal OUT1 is connected to the low voltage through the transistor T2 when the transistor is turned off, the output terminal OUT1 continuously outputs the low voltage.

In addition, since the transistors T12 and T13 are turned off, the node J3 is maintained to be floated. The voltage at the node J5 is reduced to be lower than the voltage at the node J4 and the voltage at the node J3 is maintained to be lower than the voltage at the node J5 by the capacitor C1, and therefore the transistor T7 is turned off. In addition, since the transistor T8 is turned off, the voltage at the node J4 is correspondingly reduced, and the transistor T3 is maintained to be turned off. Further, since the gate of the transistor T10 is connected to the low voltage of the first clock signal CLK1 and the voltage at the node J2 is the low voltage, the transistor T10 is maintained to be turned off.

Subsequently, when the first clock signal CLK1 becomes high, the transistors T12 and T7 are turned on, the voltage at the node J4 is increased to turn of the transistor T3 to transmit the low voltage to the node J2, and therefore the output terminal OUT1 continuously outputs the low voltage. That is, even though the output of the next-stage gate output Gout(j+2) is low, the voltage at the node J2 may be the low voltage.

In addition, since the gate of the transistor T10 is connected to the high voltage of the first clock signal CLK1, the voltage at the node J2 is the low voltage, and the transistor T10 is turned on to output the low voltage at the node J2 to the node J1. Further, since the drains of the transistors T1 and T14 are connected to the clock terminal CK1, the first clock signal CLK1 is continuously applied thereto. Particularly, since the transistor T1 is formed to be relatively larger than other transistors, parasitic capacitance between the gate and the drain is increased, and a voltage variation of the drain may affect the gate voltage. Accordingly, when the clock signal CLK1 becomes high, the gate voltage is increased by the parasitic capacity between the gate and the drain, and the transistor T1 may be turned on. Further, since the low voltage at the node J2 is output to the node J1, the gate voltage of the transistor T1 is maintained to be the low voltage to prevent the transistor T1 from being turned on.

Subsequently, the voltage at the node J1 is maintained in the low voltage until the previous-stage carry output Cout(j−2) becomes high, the voltage at the node J2 is the low voltage through the transistor T3 when the first clock signal CLK1 is high and the third clock signal CLK3 is low, and it is maintained in the low voltage through the transistor T5 when the third clock signal CLK3 is high and the first clock signal CLK1 is low.

In addition, the transistor T6 receives the initialization signal INT generated from a last dummy stage (not shown) to transmit the gate-off voltage Voff to the node J1, the voltage at the node J1 is set to be the low voltage again.

In the above method, the stage STj generates the carry output Cout(j) and the gate output Gout(j) by synchronizing the clock signals CLK1 and CLK3 based on the previous-stage carry output Cout(j−2) and the next-stage gate output Gout(j+2).

As described above, since the stages 410L1 and 410L2 of the first and second gate drivers 400L1 and 400L2 and the stages 410R1 and 410R2 of the third and fourth gate drivers 410R1 and 410R2 are respectively positioned on the left and right sides, they may be appropriately integrated when the vertical width of the pixel PX is less. That is, in small and medium-sized display devices that are below 17 inches, since the vertical width of the pixel PX is less than the vertical widths of the stages 410L1, 410L2, 410R1, and 410R2, the stages may be sufficiently integrated when one of the stages 410L1, 410L2, 410R1, and 410R2 is disposed for every two pixels and the stages 410L1, 410L2, 410R1, and 410R2 are alternately disposed on the left and right sides according to the exemplary embodiment of the present invention.

Accordingly, since two gate drivers positioned on the left and right sides of one of the gate lines $G_1$ to $G_{2n}$ simultaneously apply the gate signal, a charging rate difference of the gate signal due to the RC delay is minimized, and a brightness difference between the upward and downward neighboring pixels may be minimized.

As described, the stages may be appropriately integrated in the small and medium-sized display device since they are disposed on the left and right sides, and further, the charging rate difference may be minimized since the gate drivers positioned on the left and right sides of the liquid crystal panel assembly simultaneously apply gate signal to one gate line.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A driving apparatus of a display device for applying gate signals to gate lines connected to a plurality of pixels, the driving apparatus comprising:
   first and second gate drivers connected to the gate lines and positioned on one side of the display device side by side;
   third and fourth gate drivers connected to the gate lines and positioned on the other side of the display device side by side;
   a plurality of first clock signal lines disposed between the first gate driver and the second gate driver;
   a first initialization signal line disposed between the first gate driver and the second gate driver;
   a first gate-off voltage line disposed between the first gate driver and the second gate driver;
   a plurality of second clock signal lines disposed between the third gate driver and the fourth gate driver;
   a second initialization signal line disposed between the third gate driver and the fourth gate driver; and
   a second gate-off voltage line disposed between the third gate driver and the fourth gate driver,
   wherein the first and third gate drivers simultaneously apply the gate signals to the same gate line, and the second and fourth gate drivers simultaneously apply the gate signals to the same gate line and
   wherein two pixels immediately neighboring in a column direction among the pixels are positioned between two immediately neighboring gate lines.

2. The driving apparatus of claim 1, wherein the first and third gate drivers are connected to even-numbered gate lines among the gate lines, and the second and fourth gate drivers are connected to odd-numbered gate lines among the gate lines.

3. The driving apparatus of claim 2, wherein the first to fourth gate drivers each comprises a plurality of stages which are connected to each other, generate the gate signals and apply them to the gate lines, and a vertical width of one stage is greater than a vertical width of one pixel.

4. The driving apparatus of claim 3, wherein a first stage in the first gate driver and a second stage in the second gate driver are disposed side by side, and a third stage in the third gate driver and a fourth stage in the fourth gate driver are disposed side by side.

5. The driving apparatus of claim 4, wherein the first to fourth stages generate the gate signal based on first and fourth clock signals and apply it to the gate line, the first and third stages receive the second and fourth clock signals, and the second and fourth stages receive the first and third clock signals.

6. The driving apparatus of claim 5, wherein the first to fourth stages receive a gate-off voltage and an initialization signal, and the first to fourth stages respectively comprise a set terminal, a gate voltage terminal, first and second clock terminals, a reset terminal, a frame reset terminal, a gate output terminal, and a carry output terminal.

7. The driving apparatus of claim 6, wherein the set terminal receives an output of a previous stage, the gate voltage terminal receives the gate-off voltage, the first and second clock terminals receive one of the first to fourth clock signals, the reset terminal receives an output of a next stage, and the frame reset terminal receives the initialization signal.

8. The driving apparatus of claim 7, wherein the first to fourth stages are integrated with the display device.

9. A display device comprising a display panel comprising gate lines respectively connected to a plurality of pixels, the display device comprising:
   first and second gate drivers connected to a gate line and positioned on one side of the display device side by side;
   third and fourth gate drivers connected to a gate line and positioned on the other side of the display device side by side;
   a plurality of first clock signal lines disposed between the first gate driver and the second gate driver;
   a first initialization signal line disposed between the first gate driver and the second gate driver;
   a first gate-off voltage line disposed between the first gate driver and the second gate driver;
   a plurality of second clock signal lines disposed between the third gate driver and the fourth gate driver;
   a second initialization signal line disposed between the third gate driver and the fourth gate driver; and
   a second gate-off voltage line disposed between the third gate driver and the fourth gate driver,
   wherein the first and third gate drivers are connected to the same gate line, and the second and fourth gate drivers are connected to the same gate line and wherein two pixels immediately neighboring in a column direction among the pixels are positioned between two immediately neighboring gate lines.

10. The display device of claim 9, wherein the first and third gate drivers are connected to even-numbered gate lines among the gate lines, and the second and fourth gate drivers are connected to odd-numbered gate lines among the gate lines.

11. The display device of claim 10, wherein the first to fourth gate drivers are connected to each other, they respectively comprise a plurality of stages for generating the gate signals and applying them to the gate lines, and a vertical width of one stage is greater than a vertical width of one pixel.

12. The display device of claim 11, wherein a first stage in the first gate driver and a second stage in the second gate driver are disposed side by side, and a third stage in the third gate driver and a fourth stage in the fourth gate driver are disposed side by side.

13. The display device of claim 12, wherein the first to fourth stages generate the gate signals based on first and fourth clock signals and apply them to the gate lines, the first and third stages receive the second and fourth clock signals, and the second and fourth stages receive the first and third clock signals.

14. The display device of claim 13, wherein the first to fourth stages receive a gate-off voltage and an initialization signal, and the first to fourth stages respectively comprise a set terminal, a gate voltage terminal, first and second clock terminals, a reset terminal, a frame reset terminal, a gate output terminal, and a carry output terminal.

15. The display device of claim 14, wherein the set terminal receives an output of a previous stage, the gate voltage terminal receives the gate-off voltage, the first and second clock terminals receive one of the first to fourth clock signals, the reset terminal receives an output of a next stage, and the frame reset terminal receive the initialization signal.

16. The display device of claim 15, wherein the first to fourth stages are integrated with the display device.

* * * * *